United States Patent [19]

Sherif

[11] Patent Number: 4,923,849
[45] Date of Patent: May 8, 1990

[54] PROCESS FOR FORMING METAL OXIDE SUPERCONDUCTORS FROM A PRECURSAR MATERIAL OF THE GENERAL FORMULA YBA$_2$CU$_3$(OH)$_3$(OX)$_2$O$_3$H$_2$O (WHERE OX IS AN OXALATE)

[75] Inventor: Fawzy G. Sherif, Stony Point, N.Y.

[73] Assignee: Akzo America Inc., New York, N.Y.

[21] Appl. No.: 309,512

[22] Filed: Feb. 10, 1989

Related U.S. Application Data

[63] Continuation of Ser. No. 109,338, Oct. 16, 1987, Pat. No. 4,804,649.

[51] Int. Cl.$^5$ .................. C01F 11/04; C01F 17/00; C01G 3/02; H01L 39/12
[52] U.S. Cl. ........................................ 505/1; 252/518; 252/521; 423/263; 423/593; 423/604; 423/635; 501/123; 501/152; 505/815
[58] Field of Search ................ 252/518, 521; 423/263, 423/593, 604, 635; 501/152, 123; 505/1; 502/346

[56] References Cited

PUBLICATIONS

Cava, R. J. et al., "Bulk Superconductivity ... Ba$_2$Y Cu$_3$ O$_{9-d}$," *Phys. Rev. Lett.* vol. 58, No. 16 p. 1676–1678, Apr. 20, 1987.

Hirabayashi, M et al.: "Structure and ... Perovskite Y, Ba$_2$Cu$_3$ O$_7$" *Jpn. Jnl. Appl. Phys.* vol. 26, No. 4, pp. L454–L455, Apr. 1987.

Clark, R. et al.: "Oxalate Precipitation Methods for Preparing the Yttrium–Barium–Copper Superconducting Compound" *High–Temperature Superconducting Materials*, Ed. by W. E. Hatfield et al., published by Marcel Dekker, Inc., New York, 1988 p. 153–158.

Leupin, J. et al.: "Oxalate Coprecipitation Method for preparing the Y:Ba$_2$: Cu$_3$: Ox Superconducting Phase" Abstract No. 918 *Symposium on High Temp. Superconducting Materials*, Sep. 18–19, 1987, Univ. of North Carolina.

*Primary Examiner*—Paul Lieberman
*Assistant Examiner*—John E. Boyd
*Attorney, Agent, or Firm*—Richard P. Fennelly; Louis A. Morris

[57] ABSTRACT

Metal oxide superconductors of the yttrium-barium-copper type can be formed by precipitation from an aqueous solution of the salts of the metals using an oxalate precipitation reagent under basic pH conditions to form a fireable precursor only partly in the form of the oxalate salts of these metals.

4 Claims, No Drawings

PROCESS FOR FORMING METAL OXIDE SUPERCONDUCTORS FROM A PRECURSOR MATERIAL OF THE GENERAL FORMULA YBA$_2$CU$_3$(OH)$_3$(OX)$_2$O$_3$H$_2$O (WHERE OX IS AN OXALATE)

This application is a continuation of application 07/109,338 now patent 4,804,649 filed Oct. 16, 1987.

BACKGROUND OF THE INVENTION

1. Field of the Invention

The present invention relates to a chemical process for forming metal oxide superconductors of the YBa$_2$Cu$_3$O$_y$ type (y=6.4–7.1, preferably about 6.9).

2. Description of the Prior Art

As indicated by E. M. Engler in Chemtech, September 1987, pp. 542–551, metal oxide superconductor technology is an extremely fertile area of current research. Perovskite metal oxide superconductors comprising admixtures of metals from Groups IB, IIA and IIIB of the Periodic Table of various types have been identified. A representative class includes those of the formula Y$_1$Ba$_2$Cu$_3$O$_y$, as well as materials where Y is substituted by Nd, Sm, Eu, Gd, Dy, Ho, Yb, Lu, Y$_{0.5}$-Sc$_{0.5}$, Y$_{0.5}$-La$_{0.5}$, and Y$_{0.5}$-Lu$_{0.5}$, and where Ba is substituted by Sr-Ca, Ba-Sr, and Ba-Ca.

Various processes for forming such superconductor compositions have been proposed. Engler, in the Chemtech article, indicates that such compositions can be formed by mixing and heating oxides or carbonates of the metal precursors (e.g., Y$_2$O$_3$, BaCO$_3$ and CuO). J. G. Bednorz et al. in Z. Phys. B: Condens. Matter 1986, 64, 189–193 indicated that it is possible to form La-Ba-Cu-O superconductor compositions by a wet chemical procedure using an oxalic acid precipitant. The final oxalate composition gave an impure product which comprised three mixed crystallographic phases as shown by X-ray analysis.

SUMMARY OF THE PRESENT INVENTION

The present invention relates to a process for forming metal oxide superconductors of the YBa$_2$Cu$_3$O$_y$ type, where y is from about 6.4 to 7.1, by:

(a) forming an aqueous solution comprising the soluble salts of the Y, Ba and Cu metal moieties desired in the final superconductor composition;

(b) adding an oxalate precipitation reagent to the aqueous solution under basic, rather than acidic, pH conditions to achieve coprecipitation of the metals while only partially in the form of oxalate salts; and (c) firing (e.g., one-step firing) the precipitated metal composition, after its removal from the solution, to form the desired metal oxide superconductor composition. This composition is preferably in the form of a single orthorhombic phase which shows the Meissner effect.

The control of the pH in the basic region (e.g., a pH of 11–13) results in formation of hydroxide and oxide species (i.e., for the Y and Cu metal moieties) thereby lessening the amount of carbon due to oxalate anion presence. This lessened carbon content is preferable since it allows firing at a lower temperature to form the desired final composition which has oxide linkages and substantially no carbon moieties.

Controlling the pH also results in more complete coprecipitation of the metals from solution. The precipitate is a very fine powder (e.g., of about 3 microns average size).

DETAILED DESCRIPTION OF THE PRESENT INVENTION

The first step in the instant process is the formation of a suitable aqueous composition comprising the water-soluble salts of the Y, Ba and Cu metal moieties ultimately desired in the final metal oxide superconductor. Representative salts for use can comprise yttrium nitrate, barium acetate, and copper acetate. The salts are compatible with each other's solubilities in the molar ratios of 1:2:3, respectively.

After formation of the aqueous solution of selected Y, Ba and Cu metal salts, the next step in the process is use of an oxalate precipitation agent to coprecipitate the metal values from solution in the form of insoluble salts which can be later fired to form the desired metal oxide materials. The oxalate anion is preferred over other dibasic acid anions which form insoluble salts with Groups IA, IIA, and IIIB metals in view of its lower carbon content. Use of a higher carbon content material would require higher firing temperatures and longer periods of time to insure removal of carbon values from the precipitated metal compounds.

In accordance with the present invention, it has been found that the oxalate technique for forming the metal precipitate can further be improved if the pH is controlled in the basic region to insure that the Y, Ba and Cu metal salts which are precipitated are only partially in the form of oxalates. This further reduces the carbon content as compared to oxalate precipitation under acidic conditions. Preferred pH values are above about 12, (e.g., from about 12–13+). When such pH values are employed with a Y$_1$Ba$_2$Cu$_3$O$_y$ (y=6.4 to 7.1, preferably about 6.9) precursor system, it was found that the barium values precipitated as oxalate, whereas the yttrium was a hydroxide and the copper was an oxide. The oxalate precipitation agent can be a combination of oxalic acid and an alkaline pH agent, if desired. It can also be composed of a mixture of potassium oxalate and potassium hydroxide. The oxalate content should be at least equivalent to the 1 Y, 2 Ba and 3 Cu atoms in solution. The pH should be in the range of 12–13+ to insure the in situ decomposition of the originally formed copper oxalate into copper hydroxide and then copper oxide and the yttrium oxalate into yttrium hydroxide at a final pH of about 11–13+. This in situ decomposition forms a chemically uniform, fine precursor having a particle size of from about 1 to about 5 microns.

The final part of the instant process entails the removal to the metal salt precipitate from the aqueous solution (e.g., preferably by filtration) and its subsequent firing to form the metal oxide superconductor. The firing temperatures need to be high enough to cause oxide formation from those anionic species in the precipitate (e.g., oxalate, hydroxide, etc.). For a Y$_1$Ba$_2$Cu$_3$O$_y$ system formed using the oxalate precipitation procedure of this invention, firing temperatures of from about 900° C. to about 950° C. are deemed appropriate. The firing mode is tailored to slowly decompose the oxalate at 400°–500° C. prior to the reaction of oxides to form the desired product. The product which is obtained by the instant process is substantially more pure than similar materials obtained using oxalate coprecipitation in the acidic region and contains a single orthorhombic phase of YBa$_2$Cu$_3$O$_y$ after one firing cycle. It shows the Meissner effect at liquid nitrogen temperatures. This effect can be tested by pressing the product (e.g., 10 grams at 50,000 psi) into a disc, cooling the disc in a bath of liquid nitrogen, and placing a small magnet above the disc to levitate the magnet above the disc.

One advantage of the instant process is that firing was carried out in a closed furnace in the presence of air. Other processes, utilizing oxalate coprecipitation in the acidic region, needed firing in an oxygen atmosphere to render the material superconductive. The use of oxygen requires special materials of construction for the furnace for safety considerations and this makes such firing processes more costly.

EXAMPLE 1

Copper acetate.$H_2O$ (179.64 grams) was dissolved in 2200 milliliters of water at 50° C. forming a 0.9M solution. Barium acetate (153.26 grams) was dissolved in 250 milliliters of water forming a 0.6M solution. Both of the aforementioned solutions were mixed and a $YCl_3$ solution (135.5 milliliters) containing 25% $Y_2O_3$ was added with stirring to yield at 0.3M solution of Y. A clear blue solution resulted.

Oxalic acid (320 grams) and potassium hydroxide (270 grams) was dissolved in 600 milliliters of water. The resulting solution was added all at once to the copper, barium, yttrium solution previously formed with stirring. The pH was adjusted to 11.5 by adding a few millimeters of saturated potassium hydroxide solution. The solution was filtered, and the precipitate was washed and dried at 120° C. for 16 hours.

The above precursor material was then fired at 950° C. in air for 10 hours, was held at 700° C. for 3 hours, and was then cooled to room temperature. The material exhibited superconductivity as shown by the Meissner effect at liquid nitrogen temperature. The X-ray diffraction pattern corresponded to one single phase, the orthorhombic $YBa_2Cu_3O_y$.

EXAMPLE 2

Copper acetate.$H_2O$ (179.64 grams) was dissolved in 2200 milliliters distilled water at 50° C. forming a solution of 0.9M copper. Barium acetate (153.26 grams) was dissolved in 350 milliliters distilled water at room temperature forming a solution 0.6M barium. Yttrium nitrate.$6H_2O$ (109.5 grams) was dissolved in 250 milliliters distilled water forming a solution 0.3M yttrium. Oxalic acid (320 grams) was dissolved in 500 milliliters of water at 60° C., potassium hydroxide (475 grams) was dissolved in 500 milliliters of water, and both solutions were mixed to form a potassium oxalate mixture.

The copper, barium, and yttrium solutions were mixed and the potassium oxalate solution was added all at once with vigorous stirring. The pH of the solution was 11.3. A brown gelatinous precipitate formed, and it was filtered, washed thoroughly with water, dried at 120° C., and crushed to a fine powder. The elemental analysis shown in the table below suggested $YBa_2Cu_3(OH)_3(Ox)_2O_3.H_2O$.

| Element | Found | Calc. |
|---|---|---|
| C | 6.44 | 5.67 |
| H | 0.94 | 0.59 |
| Y | 9.50 | 10.49 |
| Ba | 27.3 | 32.42 |
| Cu | 20.6 | 22.5 |
| Oxalate | 21.6 | 20.77 |

The above analysis gave an elemental ratio very close to 1 Y, 2 Ba, 3 Cu.

EXAMPLES 3-9

The precursor material (before firing) described in Example 2 was prepared at different terminal pH values in these Examples. The Y, Ba and Cu solutions were mixed as in Example 2. The precipitant solutin varied from oxalic acid alone (at low pH) to oxalic acid/potassium hydroxide mixtures (at higher pH values). The coprecipitates were washed, dried at 120° C. for 16 hours, then crushed to a fine brown powder. In each Example, portions of the product were titrated with standard potassium permanganate solution in acid media to determine the oxalate content.

The results showed that at reaction terminal pH values of from about 0.7 to bout 7.0, the oxalate in the product corresponded to all oxalates of Y, 2 Ba and 3 Cu, i.e., 45.7% by weight. At a pH of about 11 to about 13, the oxalate content corresponds to only the barium, i.e., 20.8%. The results are as follows:

| Example No. | Final pH | Wt. % Oxalate |
|---|---|---|
| 3 | 0.7 | 46.1 |
| 4 | 0.7 | 48.2 |
| 5 | 0.7* | 46.9 |
| 6 | 6.4 | 44.5 |
| 7 | 11.3 | 24.7 |
| 8 | 11.6 | 24.4 |
| 9 | 12.6 | 15.2 |

*reverse addition of Y, Ba, Cu solution to oxalate.

The particle size distribution of each product was determined by the Laser Granulometer. On the acid side, the product has an approximate median size of 13 microns. In the basic pH range, the median particle size was 3 microns. The results of the relationship between the terminal pH of the coprecipitation reaction and the size of the particles are summarized below.

| Example No. | Terminal pH of Reaction Mixture | Median Particle Size (Microns) |
|---|---|---|
| 3 | 0.7 | 22 |
| 4 | 0.7 | 13 |
| 5 | 0.7* | 21 |
| 6 | 6.4 | 17 |
| 7 | 11.3 | 2.6 |
| 8 | 11.6 | 3.2 |
| 9 | 12.6 | 3.0 |

*reverse addition of Y, Ba, Cu solution to oxalate.

Small particles are advantageous because upon firing, a highly dense superconductor is formed. High density material will have low resistance to electric current.

In the above Examples, the precursors were fired in air at 450° C. for 2 hours, then at 950° C. for 10 hours, and at 700° C. for 3 hours and were cooled slowly to room temperature. Cooling from 950° C. to room temperature took 10 hours. It was found that the material whose precursors were prepared in acid media did not show the Meissner effect whereas the material prepared from the precursors at a pH of 11-13 gave the Meissner effect. Furthermore, X-ray analysis of the material whose precursors were prepared in acid media showed mixed phases of CuO and $YBa_2Cu_3O_y$, whereas the material prepared from precursors at a pH of 11-13 showed one single phase of orthorhombic $YBa_2Cu_3O_y$.

EXAMPLE 10

This Example shows that when the hydroxides and oxalates of Y, Ba and Cu are not coprecipitated but are formed in two separate steps, the formed precursor does not give a superconductive material as indicated by the absence of the Meissner effect.

A solution of Y, Cu and Ba salts was prepared as described in Example 2. A solution of potassium hydroxide containing 151.2 of KOH grams and 500 cc water was slowly added to the mixture of the three metal salts, with stirring. Then a solution of potassium oxalate was added. This solution contained 75.6 grams oxalic acid, 67.2 grams potassium hydroxide, and 500 cc water. The terminal pH of the reaction was 8.9.

The gelatinous precipitate that resulted was filtered, washed with water, and was dried at 120° C. for 16 hours. It contained 21.5% oxalate which corresponded to barium oxalate. This material was fired at 950° C. for 10 hours and was cooled and held at 700° C. for 3 hours. The product did not show the Meissner effect. The X-ray analysis showed a mix of copper oxide as a major component and $YBa_2Cu_3O_y$ as a minor phase component.

EXAMPLE 11

The superconducting properties of the metal oxide superconductor prepared from material prepared according to the chemical process described in Example 1 was evaluated by measuring the changes in resistance with temperature. The results were compared to those of a superconductor prepared from a precursor material prepared by physical mixing and then firing of the oxide and carbonate.

The superconductor prepared from the precursor material prepared according to Example 1 showed a sharp drop in resistivity with a transitional temperature width between 95.7° and 94.1° K. and a mid point of 94.8° K. The superconductor prepared from the precursor material prepared by the physical mixing and firing showed a less sharp drop in resistivity with a transitional temperature width between 93.6° and 90° K. and a mid point of 92.0° K.

I claim:

1. A precursor material of the general formula $YBa_2Cu_3(OH)_3(Ox)_2O_3 \cdot H_2O$, where Ox is oxalate for a yttrium-barium-copper-oxide superconductor.

2. The precursor of claim 1 which can be fired to a compositin comprising a single phase of orthorhombic $YBa_2Cu_3O_y$, with y ranging from 6.4 to 7.1.

3. The precursor of claim 2 wherein y is about 6.9.

4. The precursor of claim 2 wherein the firing is conducted in a single step.

* * * * *